(12) United States Patent
Kim

(10) Patent No.: US 11,696,505 B2
(45) Date of Patent: Jul. 4, 2023

(54) METHOD FOR MANUFACTURING ULTRASONIC FINGERPRINT SENSOR BY USING NANOROD STRUCTURE

(71) Applicant: Korea Polytechnic University Industry Academic Cooperation Foundation, Gyeonggi-do (KR)

(72) Inventor: Kyoung Kook Kim, Gyeonggi-do (KR)

(73) Assignee: KOREA POLYTECHNIC UNIV INDUSTRY ACADEMIC COOP FDN, Siheung-si (KR)

( * ) Notice: Subject to any disclaimer, the term of this patent is extended or adjusted under 35 U.S.C. 154(b) by 487 days.

(21) Appl. No.: 16/781,543

(22) Filed: Feb. 4, 2020

(65) Prior Publication Data

US 2020/0176669 A1 Jun. 4, 2020

Related U.S. Application Data

(63) Continuation of application No. PCT/KR2018/008914, filed on Aug. 6, 2018.

(30) Foreign Application Priority Data

Aug. 4, 2017 (KR) .................. 10-2017-0099202
Aug. 6, 2018 (KR) .................. 10-2018-0091377

(51) Int. Cl.
*H01L 41/29* (2013.01)
*H01L 41/113* (2006.01)
(Continued)

(52) U.S. Cl.
CPC ......... *H10N 30/06* (2023.02); *G06V 40/1306* (2022.01); *H10N 30/077* (2023.02);
(Continued)

(58) Field of Classification Search
CPC ... H01L 41/29; H01L 41/333; H01L 41/0676; H01L 41/02603; H01L 41/02606; H01L 29/0676; G06V 40/1306
See application file for complete search history.

(56) References Cited

FOREIGN PATENT DOCUMENTS

KR  10-2009-0003889 A  1/2009
KR  10-2013-0096992 A  9/2013
(Continued)

*Primary Examiner* — John A Bodnar
(74) *Attorney, Agent, or Firm* — United One Law Group LLC; Kongsik Kim; Jhongwoo Peck

(57) ABSTRACT

The present invention is directed to a method for manufacturing an ultrasonic fingerprint sensor by using a nanorod structure, the method including: a conductive mold generating step of generating a plurality of rod generation holes; a nanorod generating step of generating nanorods by filling the plurality of rod generation holes with a nano-piezoelectric material; a side electrode generation portion marking step of marking side electrode generation portions; a conductive mold etching step of generating nanorods and side electrodes by performing primary etching on the conductive mold; an insulating material filling step of filling portions with an insulating material; a lower electrode forming step of performing secondary etching and forming lower electrodes; a dummy substrate bonding step of bonding a dummy substrate to a surface on which the lower electrodes are formed; and an upper electrode forming step of removing the conductive substrate base and forming upper electrodes.

8 Claims, 17 Drawing Sheets

(51) Int. Cl.
*H01L 41/317* (2013.01)
*H01L 41/332* (2013.01)
*H01L 41/047* (2006.01)
*G06K 9/00* (2022.01)
*H10N 30/06* (2023.01)
*G06V 40/13* (2022.01)
*H10N 30/077* (2023.01)
*H10N 30/082* (2023.01)
*H10N 30/30* (2023.01)
*H10N 30/87* (2023.01)
*H10N 30/853* (2023.01)

(52) U.S. Cl.
CPC ......... *H10N 30/082* (2023.02); *H10N 30/302* (2023.02); *H10N 30/878* (2023.02); *H10N 30/8554* (2023.02)

(56) References Cited

FOREIGN PATENT DOCUMENTS

| | | |
|---|---|---|
| KR | 10-2015-0110590 A | 10/2015 |
| KR | 10-2016-0079434 A | 7/2016 |
| KR | 10-2016-0117793 A | 10/2016 |

Si mold SEM images

Views of existing filling using PZT

Views of existing filling using PZT : Sintering is excellent, but there is a problem with filling Incomplete filling occurs PZT Molded state : Considerably excellent It can be found that filling is considerably uniform throughout the device

METHOD FOR MANUFACTURING ULTRASONIC FINGERPRINT SENSOR BY USING NANOROD STRUCTURE

CROSS-REFERENCE TO RELATED APPLICATIONS

This application is a Continuation of PCT/KR2018/008914 filed on Aug. 6, 2018, which claims priority to Korean Patent Application Nos. 10-2017-0099202 and 10-2018-0091377 filed on Aug. 4, 2017 and Aug. 6, 2018, respectively, which applications are incorporated herein by reference in their entirety.

TECHNICAL FIELD

The present invention relates to a method for manufacturing an ultrasonic fingerprint sensor by using a nanorod structure, and more particularly to a method for manufacturing an ultrasonic fingerprint sensor by using a nanorod structure, in which a silicon nanorod structure and a metal electrode structure are fabricated in an integrated structure and a flip-chip structure capable of packaging various electrical signals, measured from an ultrasonic fingerprint sensor using a piezoelectric material (PZT), without wires is fabricated.

RELATED ART

As the importance of security has increased, various security methods have been proposed. Among them, fingerprint recognition is adopted in many fields because it is one of the most effective identification methods.

Meanwhile, there are many ways of recognizing fingerprints. Although an electrostatic method currently used in mobile phones is the most commonly used, this method has the disadvantage in which a fingerprint may be copied and then used. Therefore, a need for a new fingerprint recognition method capable of preventing the copying of a fingerprint other than the existing fingerprint recognition method has been increasing. In response to this, there has been proposed an ultrasonic fingerprint recognition method.

To perform ultrasonic fingerprint recognition, it is necessary to fabricate a structure using a material called lead zirconate titanate (PZT). This material is commonly known as a piezoelectric material, and has the characteristic of functioning to convert mechanical force into an electrical signal. Accordingly, when a three-dimensional fingerprint is applied to a nanoscale PZT structure in the form of mechanical force, the fingerprint is recognized at the moment that the force is applied. An ultrasonic fingerprint sensor using PZT has a feature that prevents a fingerprint from being copied because it is measured in a three-dimension manner.

In contrast, a currently used fingerprint recognition method has a limitation in security because a fingerprint is recognized by reading only a pattern in a two-dimension manner and thus a fingerprint of another person can be copied using a tape or the like.

At present, a MEMS process needs to be applied for the ultrasonic fingerprint sensor. In this case, a process for allowing for a height difference of 100 μm or more needs to be performed. In this case, a typical thin film process cannot overcome the height difference of 100 μm or more, and thus a new structure and a new process are required. Furthermore, in the process of mounting a fabricated ultrasonic fingerprint sensor on a PCB board, it is necessary to connect the device and the PCB board electrically. For this, a wire bonding method and a flip-chip bonding method are chiefly used.

In the case of the ultrasonic fingerprint sensor, the flip-chip bonding method is optimal when a use environment is taken into account. However, due to the thickness of the device, it is difficult to connect upper electrodes to a bottom through a thickness of 100 μm or more. Therefore, various technologies for implementing a flip-chip structure have been proposed so far, but there is no report on a technology for manufacturing an ultrasonic fingerprint sensor by using a stable flip-chip structure.

SUMMARY

Accordingly, the present invention has been made to solve the above problems occurring in the conventional ultrasonic fingerprint sensor, and an object of the present invention is to provide an ultrasonic fingerprint sensor having a flip-chip structure with a semiconductor nanorod structure incorporated thereinto, in which the connection of upper electrodes having difficulty in connection with the implementation of a flip-chip structure is implemented via a flip-chip structure that connects silicon nanorods with metal electrodes.

Another object of the present invention is to implement a flip-chip structure by fabricating conductive silicon or ceramic nanorods, connectable to upper metal electrodes, in an integrated form in order to connect the upper electrodes to a lower PCB.

In order to achieve at least one of the above objects, the present invention provides a method for manufacturing an ultrasonic fingerprint sensor by using a nanorod structure, the method including: a conductive mold generating step of generating a plurality of rod generation holes spaced apart at predetermined intervals by etching a conductive substrate; a nanorod generating step of generating nanorods by filling the plurality of rod generation holes with a nano-piezoelectric material; a side electrode generation portion marking step of marking side electrode generation portions on the edge of a conductive mold on first sides of the rod generation holes; a conductive mold etching step of generating nanorods and side electrodes by performing primary etching on the conductive mold except for the former nanorods, the marked side electrode generation portions, and a conductive substrate base connecting the former nanorods and the marked side electrode generation portions; an insulating material filling step of filling portions etched at the conductive mold etching step with an insulating material; a lower electrode forming step of performing secondary etching so that first end portions of the nanorods and side electrodes surrounded with the insulating material through the filling with the insulating material are exposed and forming lower electrodes on the exposed first end portions of the nanorods and the side electrodes; a dummy substrate bonding step of bonding a dummy substrate to a surface on which the lower electrodes are formed; and an upper electrode forming step of removing the conductive substrate base connecting the nanorod and the side electrodes and forming upper electrodes on the exposed remaining end portions of the nanorods and the side electrodes.

The conductive substrate and the side electrodes may be a conductive substrate and side electrodes including a material selected from the group consisting of Si, GaAs, InAs, GaN, InN, Ge, ZnO, and $Ga_2O_3$.

The conductive substrate and the side electrodes may be made of a material having a sheet resistance of 100 Ω/sq or lower.

The conductive substrate and the side electrodes may be made of a material having a shrinkage rate of 3 to 5% or lower at a sintering temperature of 800 to 1300° C.

The nanorod generating step may include: a nano-piezoelectric material filling step of filling the rod generation holes with the nano-piezoelectric material by spraying a powdered nano-piezoelectric material into the conductive mold; a bonding solution spraying step of spraying a bonding solution onto the conductive mold filled with the nano-piezoelectric material; a nano-piezoelectric material pressing step of densifying the filled nano-piezoelectric material by pressing a rod generation hole portion of the conductive mold onto which the bonding solution has been sprayed; and a nano-piezoelectric material sintering step of sintering the nano-piezoelectric material by sintering the conductive mold having undergone the nano-piezoelectric material pressing step.

The nano-piezoelectric material filling step may be performed by mixing the powdered nano-piezoelectric material with a nano-piezoelectric material in a liquid state and a nano-piezoelectric material in a gas state to form a mixture and then filling the rod generation holes with the mixture.

The nano-piezoelectric material may be a compound selected from the group consisting of a PZT ($PbZrO_3$)-based compound, a PST ($Pb(Sc,Ta)O_3$-based compound, quartz, a ($Pb,Sm$)$TiO_3$-based compound, a PMN ($Pb(MgNb)O_3$-PT ($PbTiO_3$)-based compound, a PVDF (poly(vinylidene fluoride))-based compound, and a PVDF-TrFe-based compound.

In order to achieve at least one of the above objects, the present invention provides an ultrasonic fingerprint sensor using a nanorod structure, which is manufactured by the method for manufacturing an ultrasonic fingerprint sensor by using a nanorod structure and in which side electrodes connecting the upper and lower electrodes of a sensor array include mold electrodes of a conductive substrate.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Embodiments of the present invention will be described in detail below with reference to the accompanying drawings. In the following description of the present invention, when it is determined that a detailed description of a related well-known configuration or function may obscure the gist of the present invention, the detailed description will be omitted. Furthermore, in the following description of the embodiments of the present invention, specific numerical values are merely examples.

Figure 1:
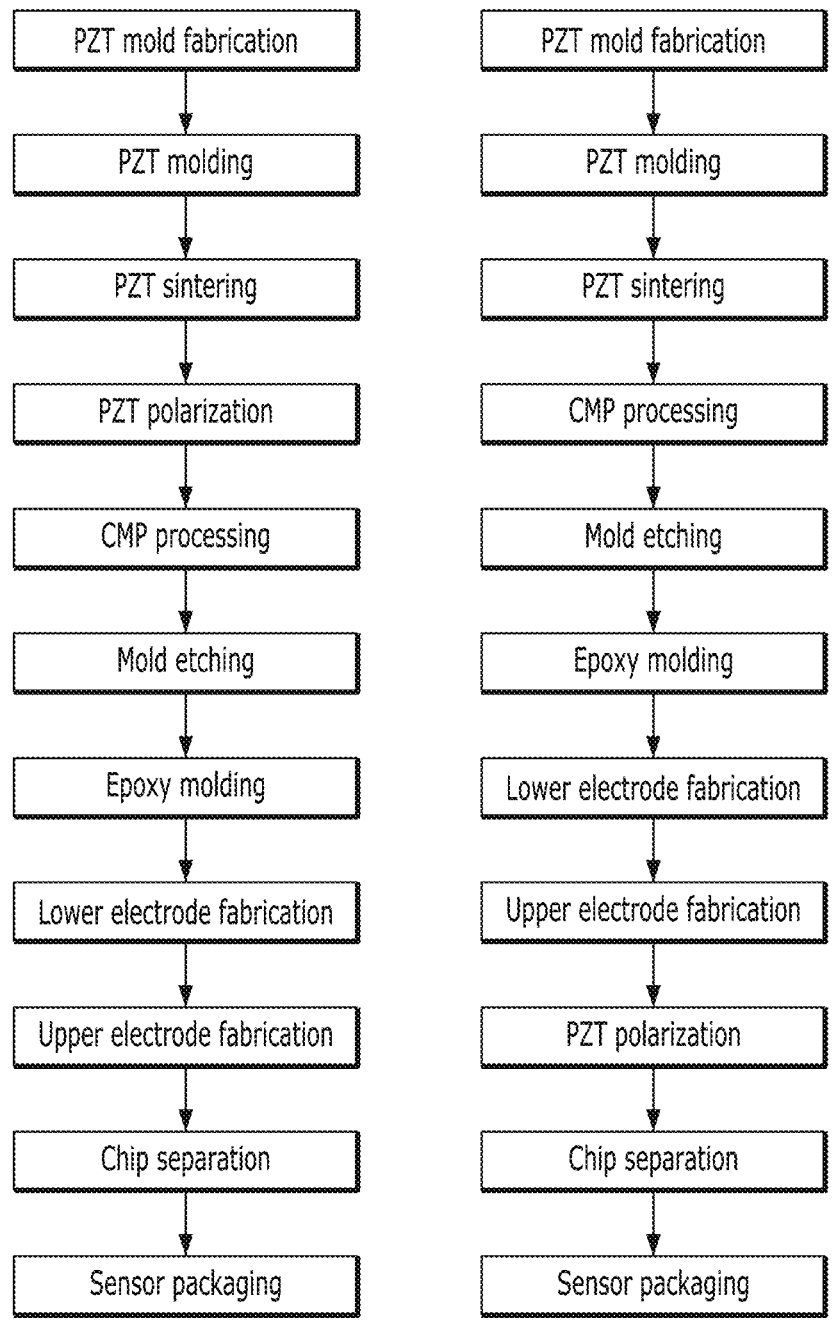
FIG. 1 is a block diagram showing a process of manufacturing a sensor package by a method for manufacturing an ultrasonic fingerprint sensor by using a nanorod structure according to an embodiment of the present invention.
Figure 2A:
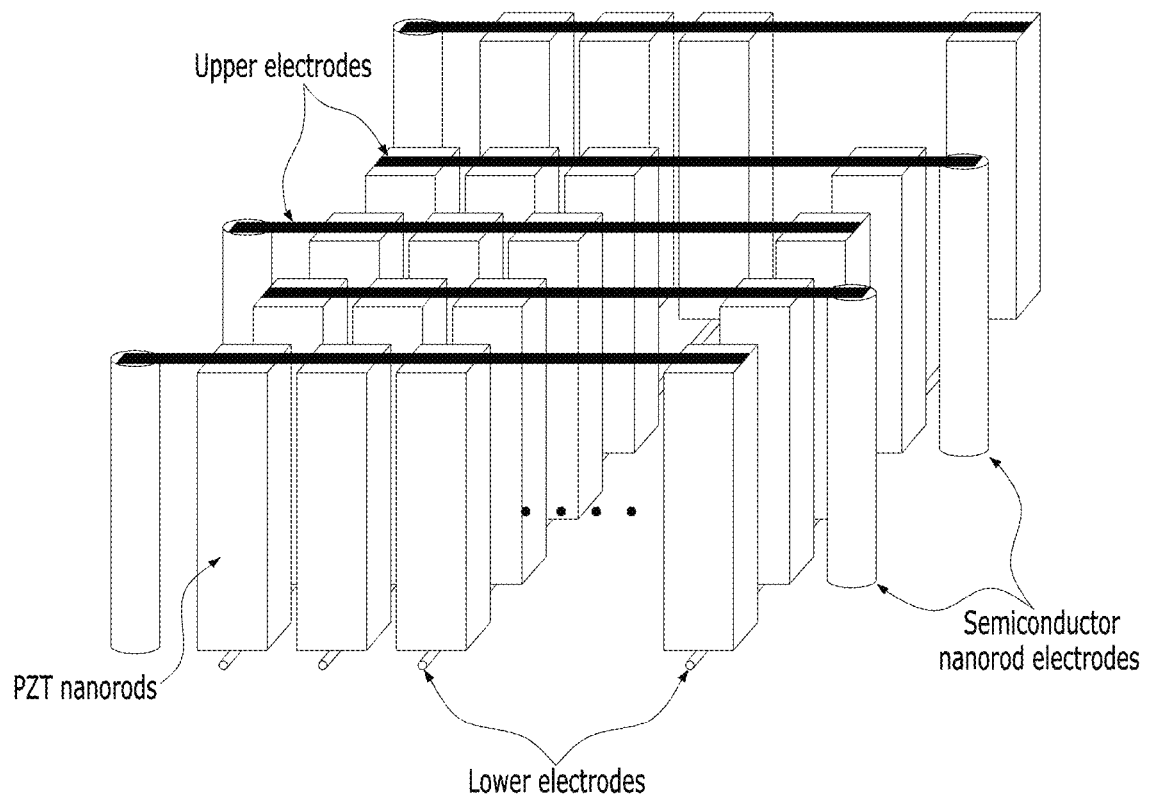
FIG. 2A is a schematic diagram showing a view of a sensor array manufactured by the method for manufacturing an ultrasonic fingerprint sensor by using a nanorod structure according to the embodiment of the present invention.
Figure 2B:
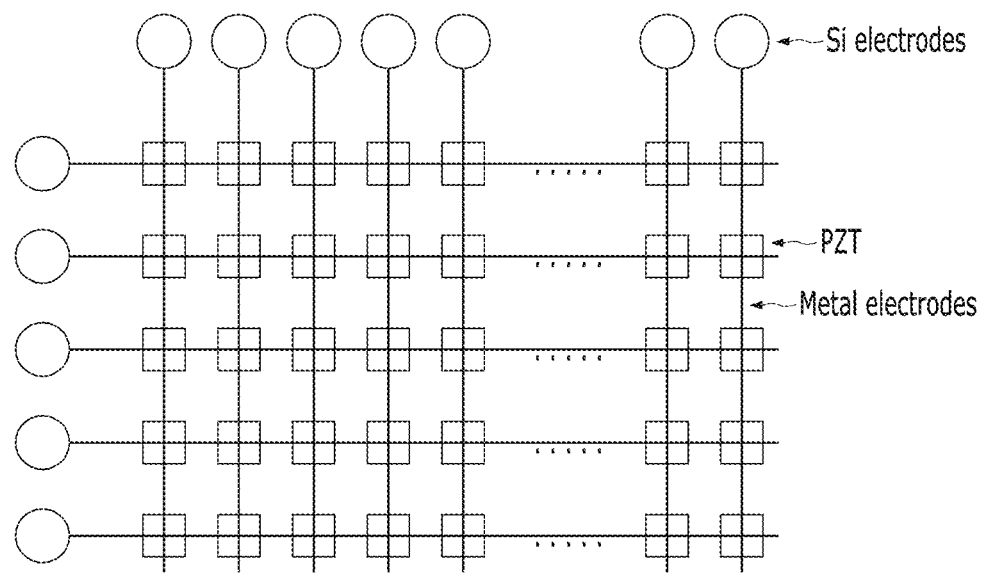
FIG. 2B is a schematic diagram showing a plan view of the sensor array manufactured by the method for manufacturing an ultrasonic fingerprint sensor by using a nanorod structure according to the embodiment of the present invention.

FIG. 1 discloses a block diagram showing a process of manufacturing a sensor package by a method for manufacturing an ultrasonic fingerprint sensor by using a nanorod structure according to an embodiment of the present invention, FIG. 2A discloses a schematic diagram showing a view of a sensor array manufactured by the method for manufacturing an ultrasonic fingerprint sensor by using a nanorod structure according to the embodiment of the present invention, and FIG. 2B discloses a schematic diagram showing a plan view of the sensor array manufactured by the method for manufacturing an ultrasonic fingerprint sensor by using a nanorod structure according to the embodiment of the present invention.

Figure 3:
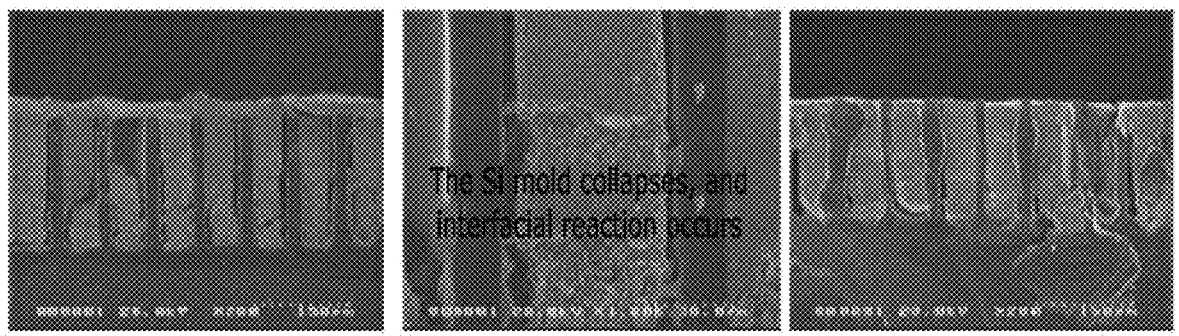
FIG. 3 shows scanning electron microscope (SEM) images illustrating views of piezoelectric rods formed in a mold substrate in a conventional method for manufacturing an ultrasonic fingerprint sensor.
Figure 3:
Figure 4:
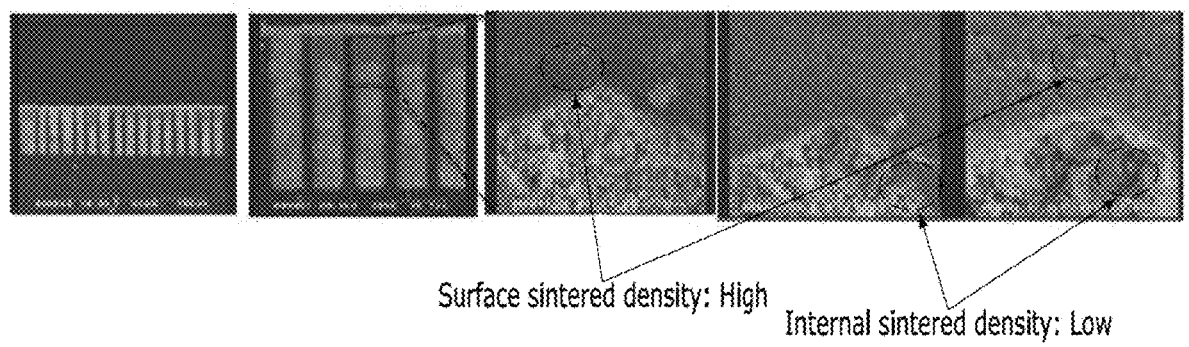
FIG. 4 shows SEM images illustrating views of piezoelectric rods formed in a mold substrate in the conventional method for manufacturing an ultrasonic fingerprint sensor.
Figure 5:
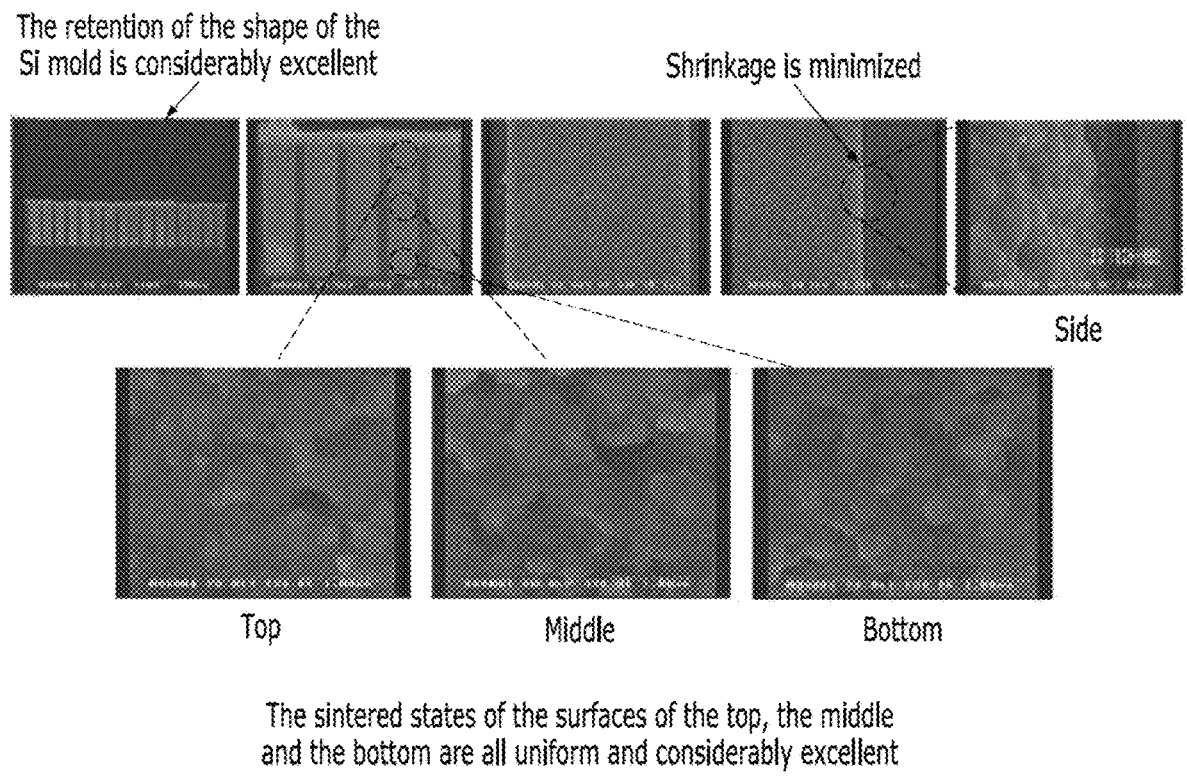
FIG. 5 shows SEM images illustrating views of nanorods formed in a conductive substrate in the method for manufacturing an ultrasonic fingerprint sensor by using a nanorod structure according to the embodiment of the present invention.

FIG. 3 discloses scanning electron microscope (SEM) images showing views of piezoelectric rods formed in a mold substrate in a conventional method for manufacturing an ultrasonic fingerprint sensor, FIG. 4 discloses SEM images showing views of piezoelectric rods formed in a mold substrate in the conventional method for manufacturing an ultrasonic fingerprint sensor, and FIG. 5 discloses SEM images showing views of nanorods formed in a conductive substrate in the method for manufacturing an ultrasonic fingerprint sensor by using a nanorod structure according to the embodiment of the present invention.

Figure 6:
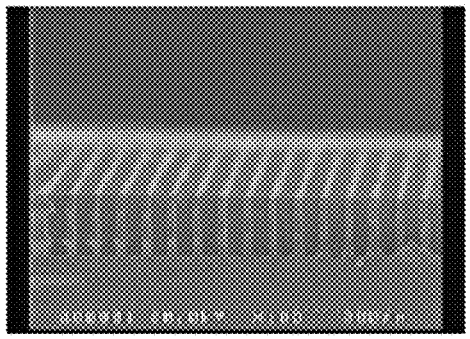
FIG. 6 shows SEM images illustrating comparisons between views of nanorods formed in a conductive substrate in the method for manufacturing an ultrasonic fingerprint sensor by using a nanorod structure according to the embodiment of the present invention and views of piezoelectric rods formed in a mold substrate in the conventional method for manufacturing an ultrasonic fingerprint sensor.
Figure 6:
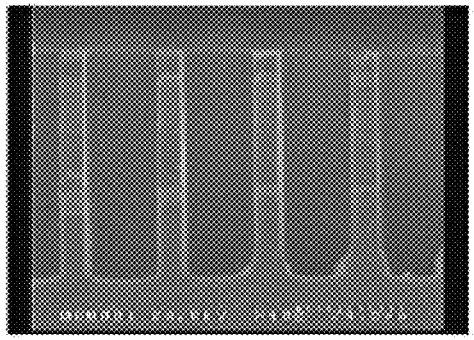
Figure 6:
Figure 6:
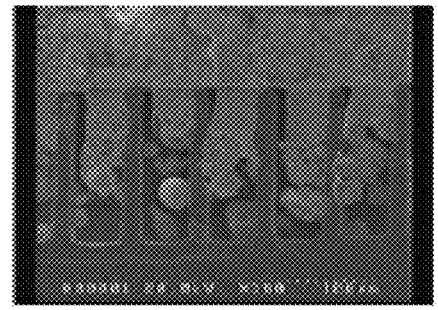
Figure 7:
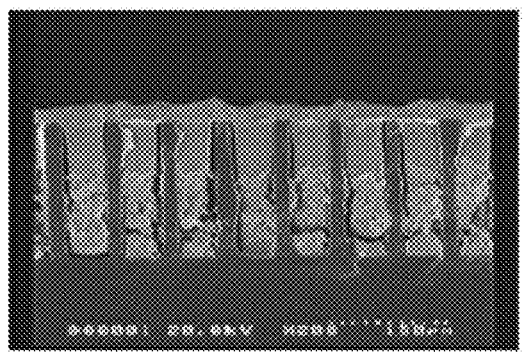
FIG. 7 shows SEM images illustrating views of piezoelectric rods formed in a mold substrate in the conventional method for manufacturing an ultrasonic fingerprint sensor.
Figure 7:
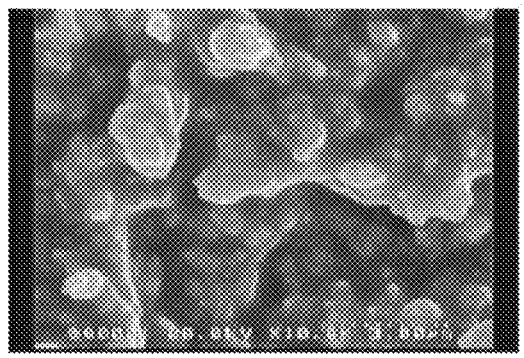
Figure 7:
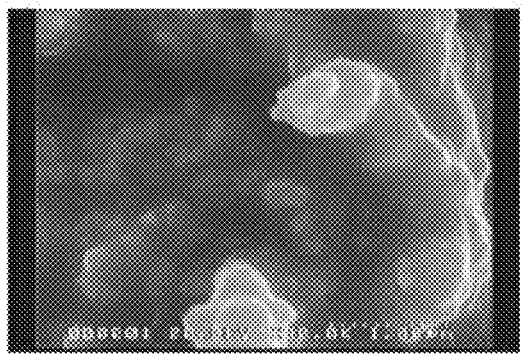
Figure 8:
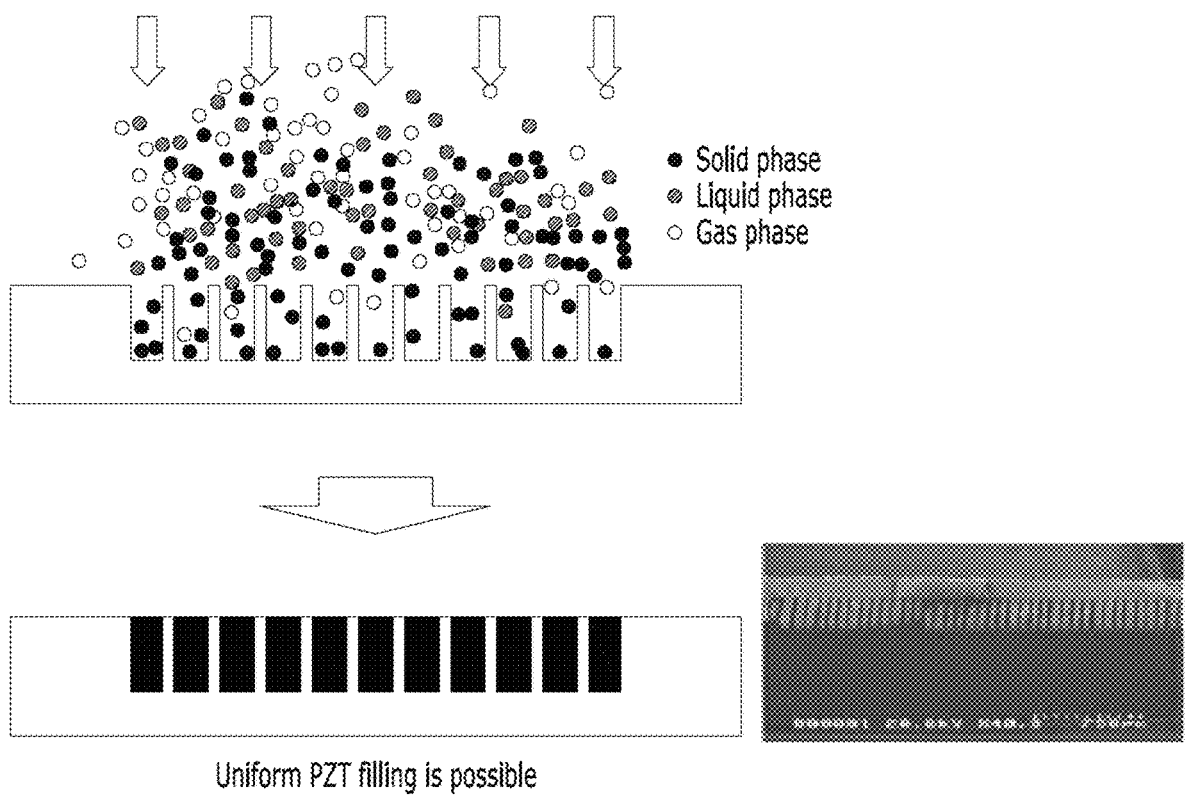
FIG. 8 shows schematic diagrams illustrating the step of generating nanorods by filling the rod generation holes of a conductive substrate with a nano-piezoelectric material in the method for manufacturing an ultrasonic fingerprint sensor by using a nanorod structure according to the embodiment of the present invention.

FIG. 6 discloses SEM images showing comparisons between views of nanorods formed in a conductive substrate in the method for manufacturing an ultrasonic fingerprint sensor by using a nanorod structure according to the embodiment of the present invention and views of piezoelectric rods formed in a mold substrate in the conventional method for manufacturing an ultrasonic fingerprint sensor, FIG. 7 discloses SEM images showing views of piezoelectric rods formed in a mold substrate in the conventional method for manufacturing an ultrasonic fingerprint sensor, and FIG. 8 shows schematic diagrams illustrating the step of generating nanorods by filling the rod generation holes of a conductive substrate with a nano-piezoelectric material in the method for manufacturing an ultrasonic fingerprint sensor by using a nanorod structure according to the embodiment of the present invention.

Figure 9:
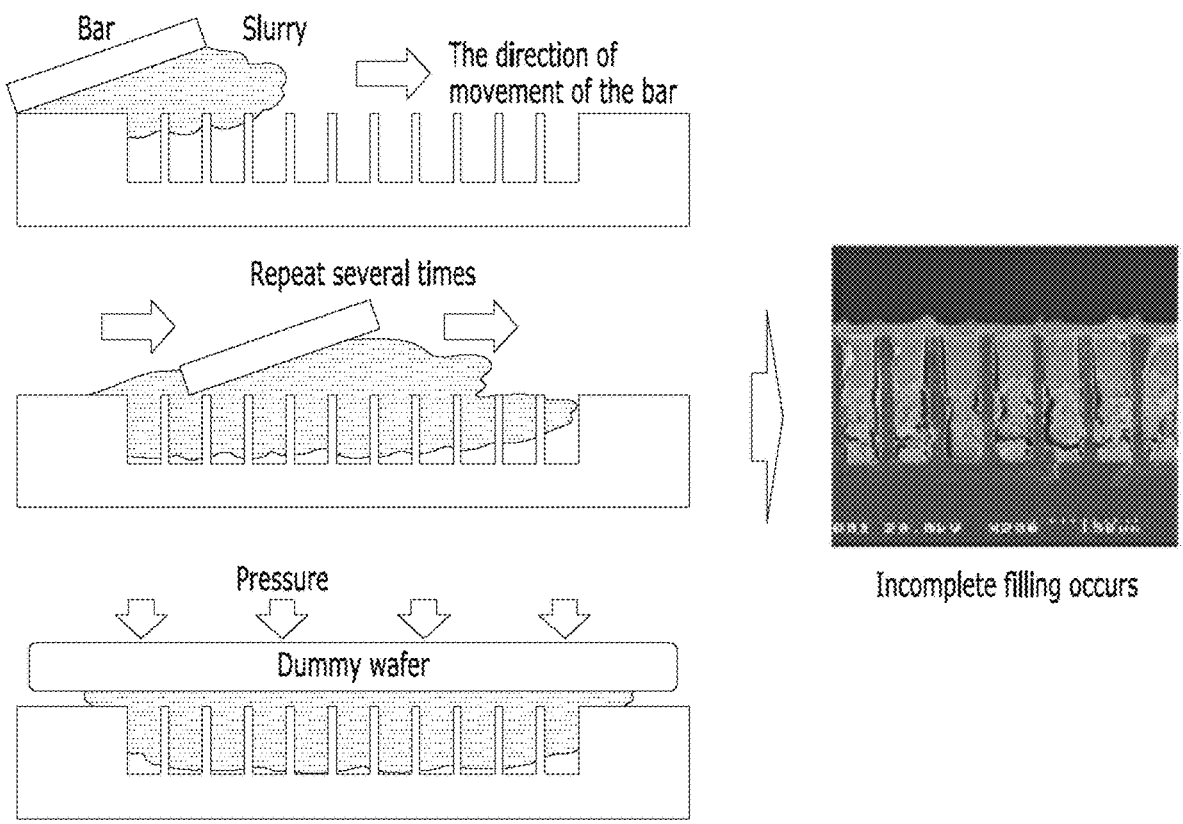
FIG. 9 shows schematic diagrams illustrating the step of generating nanorods by filling the rod generation holes of a mold substrate with a piezoelectric material in the conventional method for manufacturing an ultrasonic fingerprint sensor.
Figure 10:
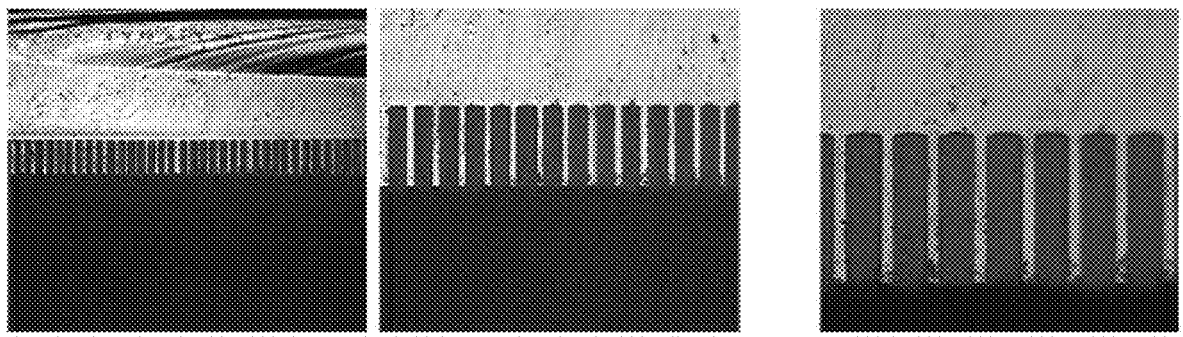
FIG. 10 shows SEM images illustrating views of piezoelectric rods formed in a mold substrate in the conventional method for manufacturing an ultrasonic fingerprint sensor.
Figure 11:
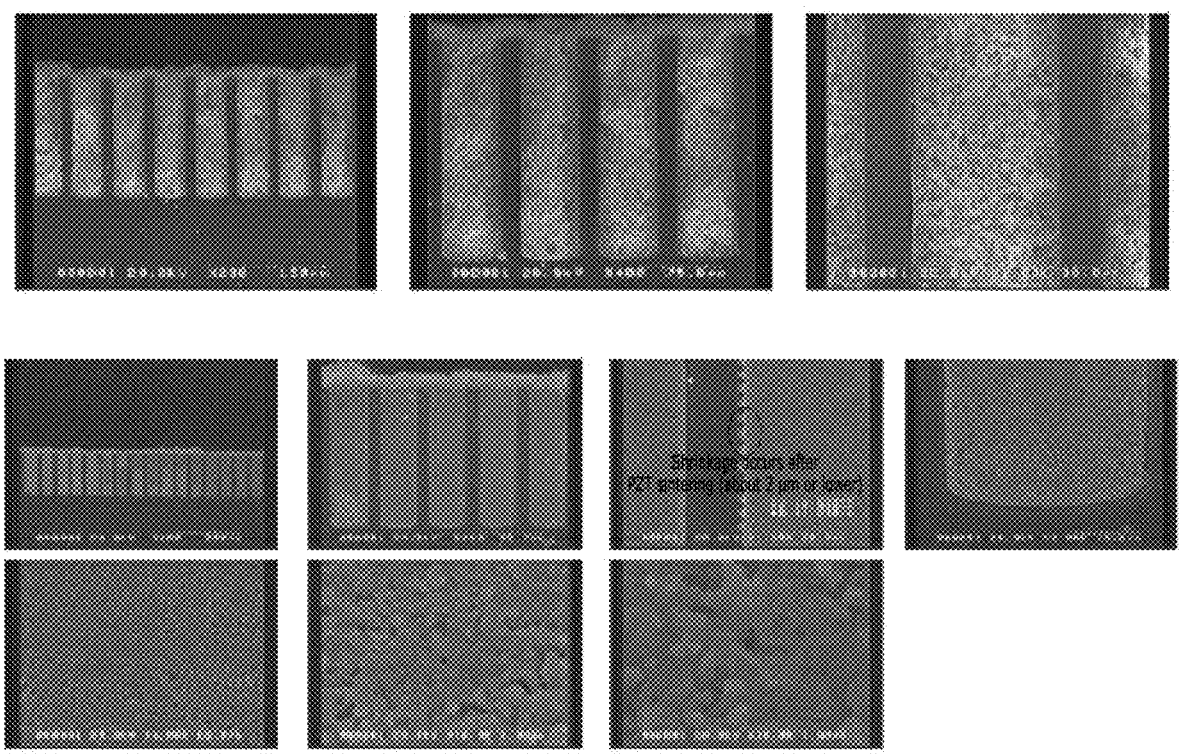
FIG. 11 shows SEM images illustrating views of nanorods formed in a conductive substrate in the method for manufacturing an ultrasonic fingerprint sensor by using a nanorod structure according to the embodiment of the present invention.

FIG. 9 discloses schematic diagrams showing the step of generating nanorods by filling the rod generation holes of a mold substrate with a piezoelectric material in the conventional method for manufacturing an ultrasonic fingerprint sensor, FIG. 10 discloses SEM images showing views of piezoelectric rods formed in a mold substrate in the conventional method for manufacturing an ultrasonic fingerprint sensor, and FIG. 11 discloses SEM images showing views of nanorods formed in a conductive substrate in the method for manufacturing an ultrasonic fingerprint sensor by using a nanorod structure according to the embodiment of the present invention.

Figure 12:
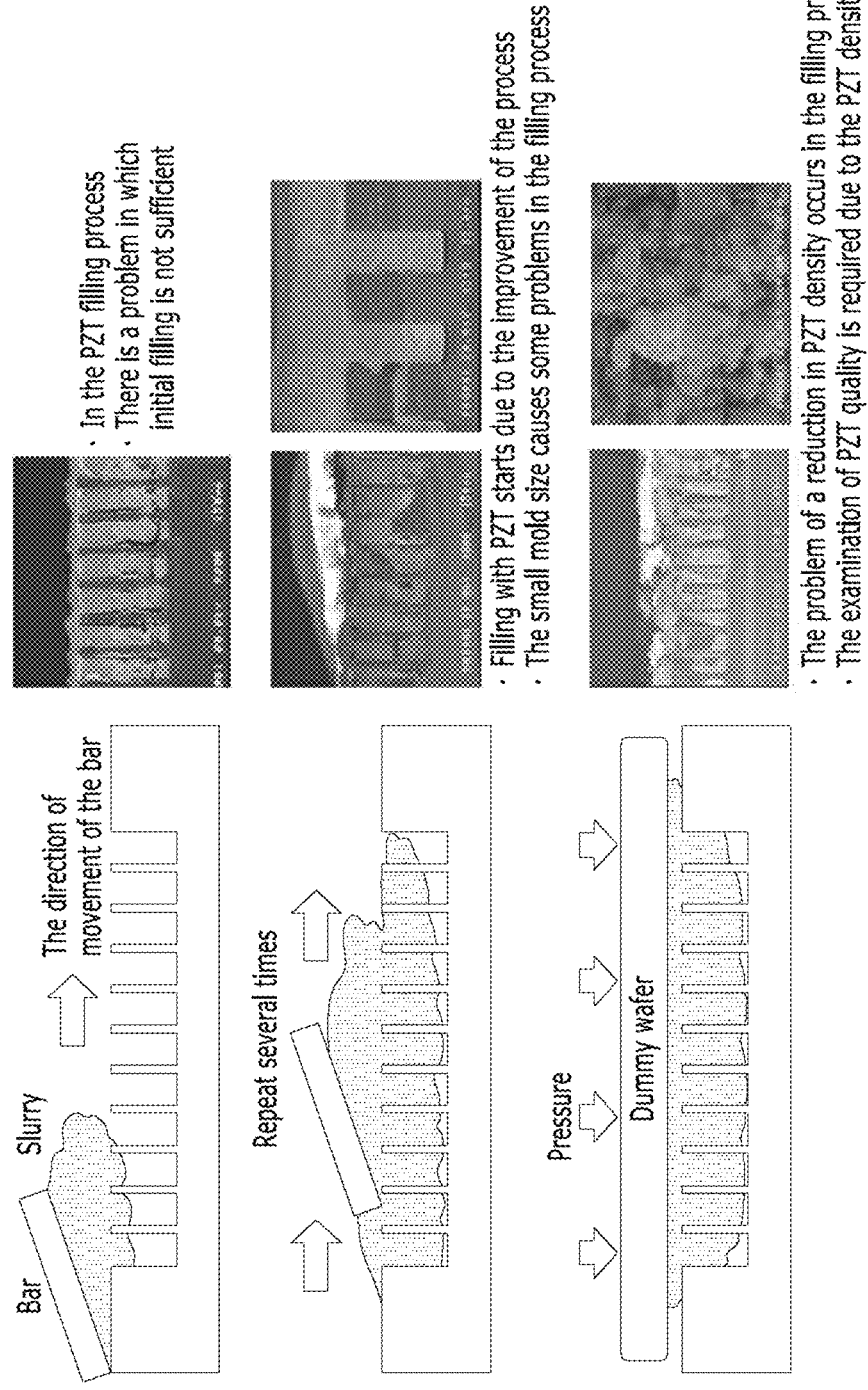
FIG. 12 shows SEM images illustrating the step of generating nanorods by filling the rod generation holes of a mold substrate with a piezoelectric material in the conventional method for manufacturing an ultrasonic fingerprint sensor and views of piezoelectric rods formed in a mold substrate.
Figure 13:
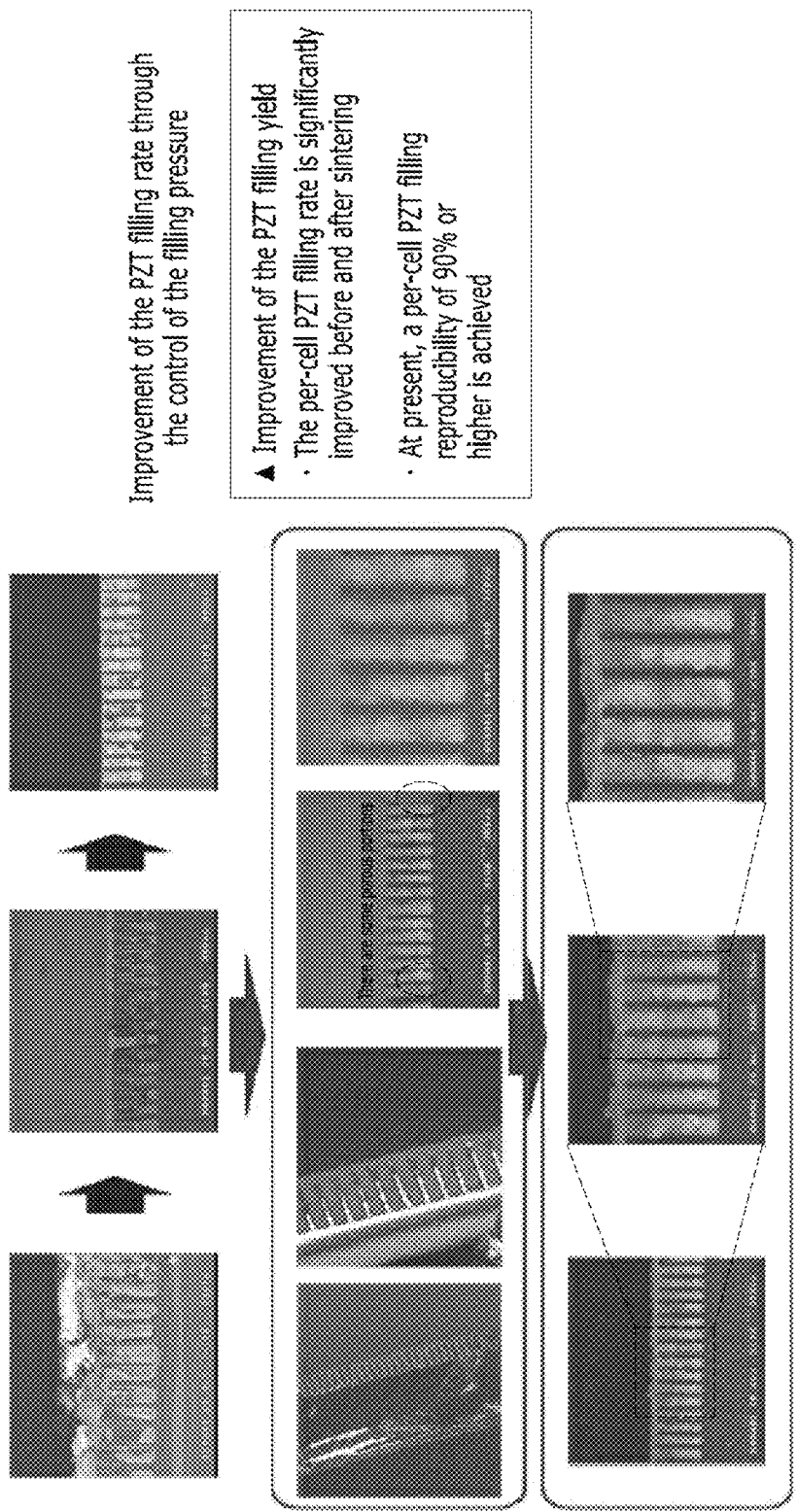
FIG. 13 shows schematic diagrams illustrating the step of generating nanorods by filling the rod generation holes of a conductive substrate with a nano-piezoelectric material in the method for manufacturing an ultrasonic fingerprint sensor by using a nanorod structure according to the embodiment of the present invention.
Figure 14:
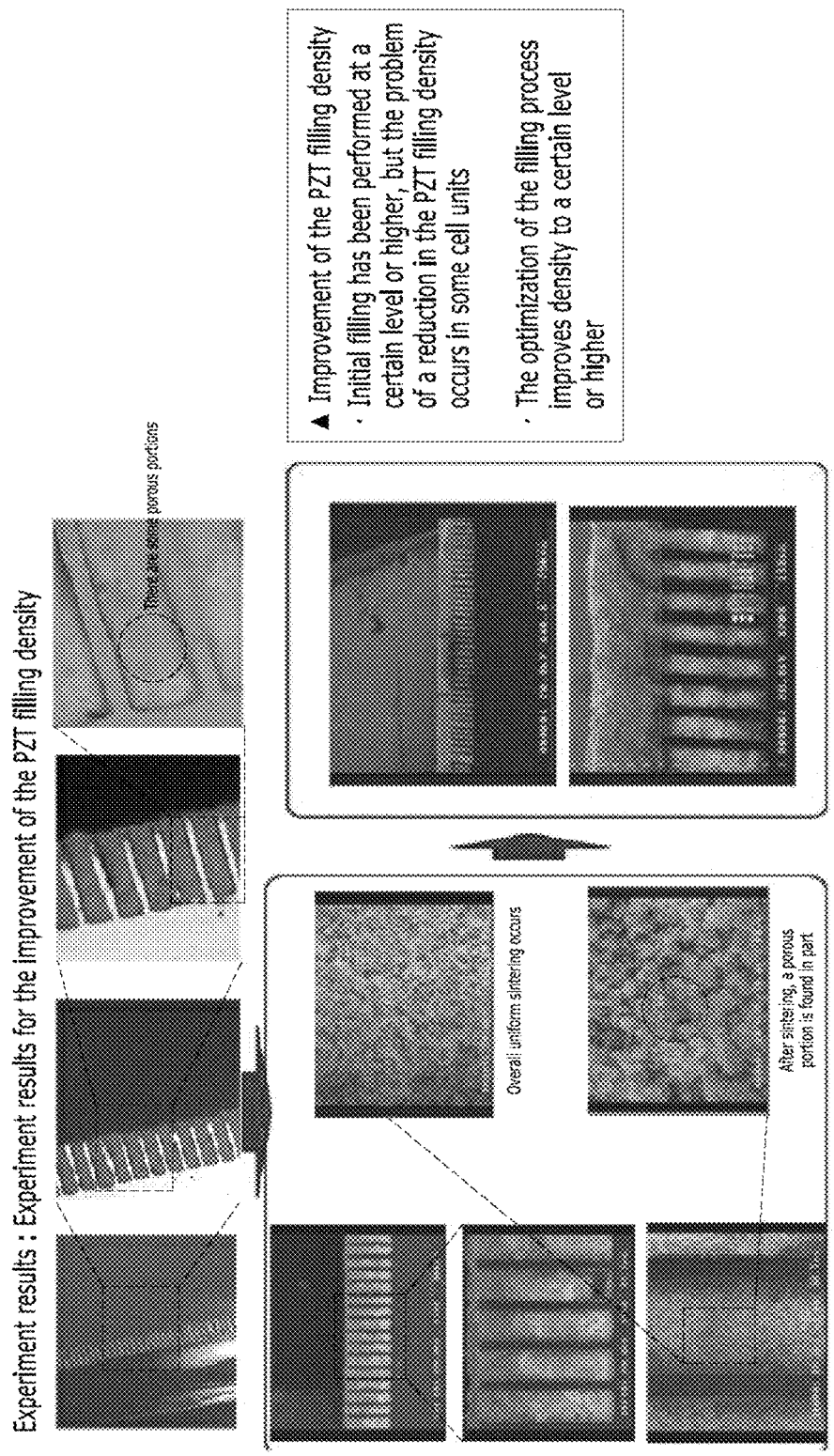
FIG. 14 shows SEM images illustrating views of nanorods formed in a conductive substrate in the method for manufacturing an ultrasonic fingerprint sensor by using a nanorod structure according to the embodiment of the present invention.

FIG. 12 discloses SEM images showing the step of generating nanorods by filling the rod generation holes of a mold substrate with a piezoelectric material in the conventional method for manufacturing an ultrasonic fingerprint sensor and views of piezoelectric rods formed in a mold substrate, FIG. 13 discloses schematic diagrams showing the step of generating nanorods by filling the rod generation holes of a conductive substrate with a nano-piezoelectric material in the method for manufacturing an ultrasonic fingerprint sensor by using a nanorod structure according to the embodiment of the present invention, and FIG. 14 discloses SEM images showing views of nanorods formed in a conductive substrate in the method for manufacturing an ultrasonic fingerprint sensor by using a nanorod structure according to the embodiment of the present invention.

Figure 15:
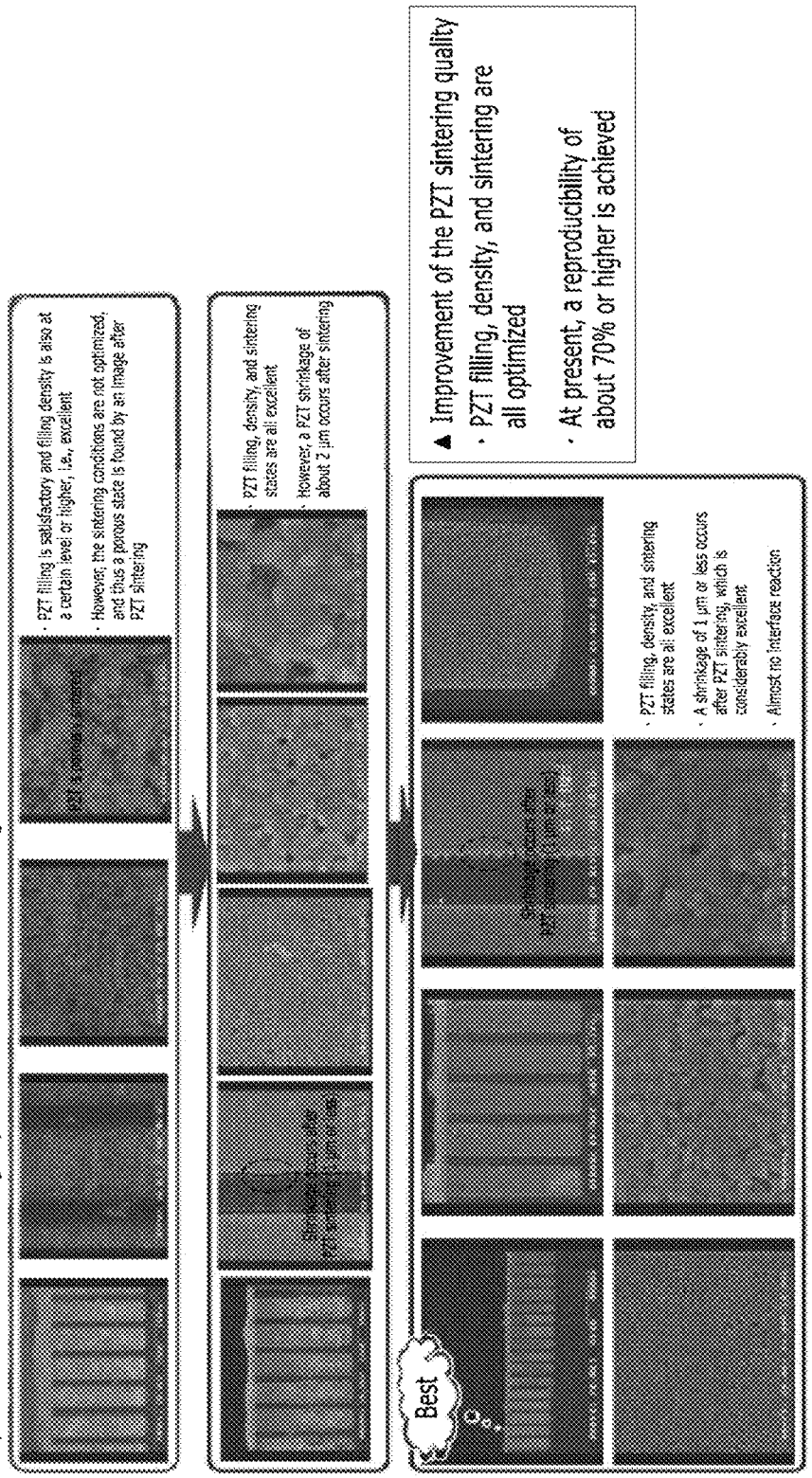
FIG. 15 shows SEM images illustrating views of nanorods formed in a conductive substrate in the method for manufacturing an ultrasonic fingerprint sensor by using a nanorod structure according to the embodiment of the present invention.

FIG. 15 discloses SEM images showing views of nanorods formed in a conductive substrate in the method for manufacturing an ultrasonic fingerprint sensor by using a nanorod structure according to the embodiment of the present invention.

Figure 16:
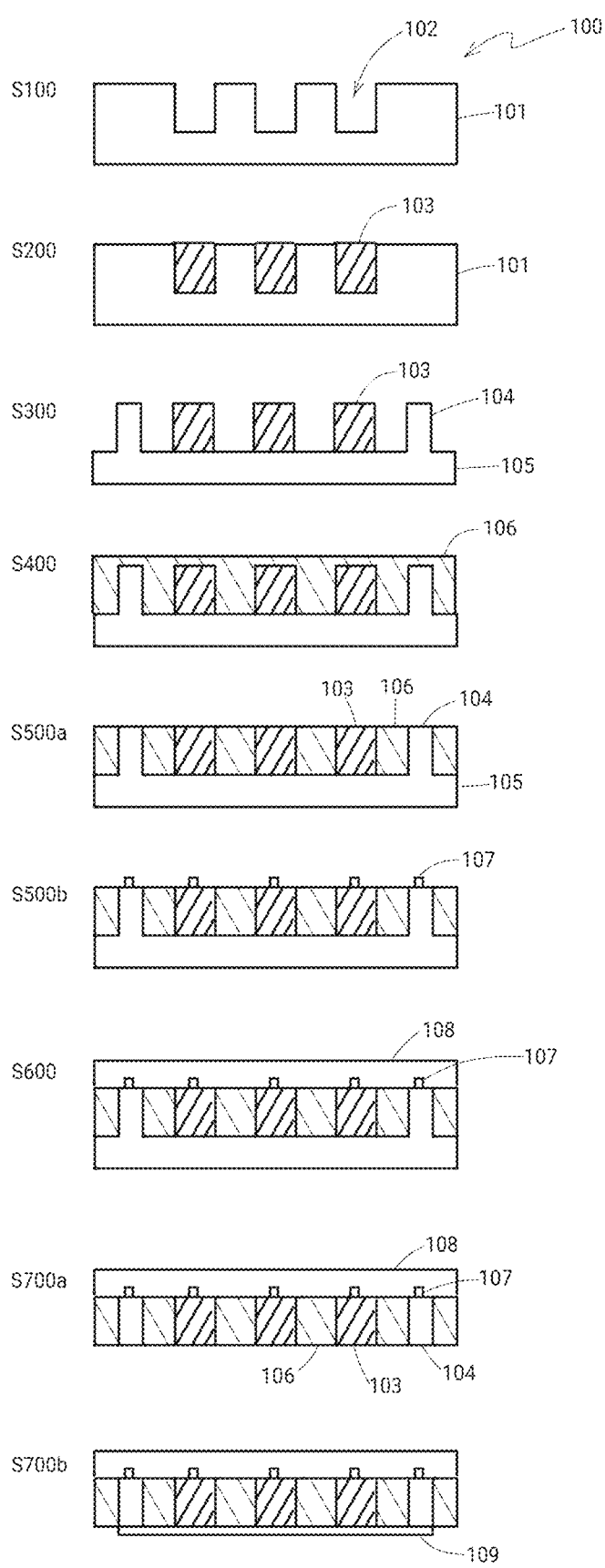
FIG. 16 schematically shows the steps of a method for manufacturing an ultrasonic fingerprint sensor by using a nanorod structure according to the present invention.

Referring to FIG. 16, a method for manufacturing an ultrasonic fingerprint sensor by using a nanorod structure according to the present invention may include: a conductive mold 100 generating step (S100) of generating a plurality of rod generation holes 102 spaced apart at predetermined intervals by etching a conductive substrate 101; a nanorod generating step (S200) of generating nanorods 103 by filling the plurality of rod generation holes 102 with a nano-piezoelectric material; a side electrode generation portion marking step of marking side electrode generation portions on the edge of the conductive mold 100 on first sides of the rod generation holes; a conductive mold etching step (S300) of generating nanorods 103 and side electrodes 104 by performing primary etching on the conductive mold 100 except for the nanorods 103, the side electrodes 104, and a conductive substrate base 105 connecting the nanorods 103 and the side electrodes 104; an insulating material filling step (S400) of filling portions etched at the conductive mold etching step (S300) with an insulating material 106; a lower electrode forming step (S500a and S500b) of performing secondary etching so that first end portions of the nanorods 103 and side electrodes 104 surrounded with the insulating material 106 through the filling with the insulating material 106 are exposed (S500a) and forming lower electrodes 107 on the exposed first end portions of the nanorods 103 and the side electrodes 104 (S500b); a dummy substrate bonding step (S600) of bonding a dummy substrate 108 to a surface of the conductive mold 100 on which the lower electrodes 107 are formed; and an upper electrode forming step (S700a and S700b) of removing the conductive substrate base 105 connecting the nanorods 103 and the side electrodes 104 (S700a) and forming upper electrodes 109 on the exposed remaining end portions of the nanorods 103 and the side electrodes 104 (S700b).

In other words, the ultrasonic fingerprint sensor using a nanorod structure is configured such that the side electrodes configured to connect the upper electrodes to the lower electrodes or the lower PCB are formed in the sensor array of the ultrasonic fingerprint sensor and the side electrodes are formed by implementing a mold substrate, used to generate the nanorods (piezoelectric rods) of the sensor array, as a conductive mold substrate and forming parts of the conductive mold substrate into the side electrodes. Accordingly, in the process of manufacturing a sensor array, the separate process of etching via holes into a mold substrate and the process of filling the via holes with a conductive filler, which are performed to form side electrodes, may be omitted. As a result, there are provided the advantages of shortening the process of manufacturing a fingerprint sensor having a flip-chip structure, improving manufacturing efficiency, and improving yield rate.

Furthermore, the ultrasonic fingerprint sensor manufactured as described above is manufactured via a sensor array having a stable flip-chip structure, thereby ensuring the stable driving of the device and extending the lifespan of the device.

The step of forming the conductive mold including the rod generation holes by etching the conductive substrate may be the step of forming a mold by etching a substrate, e.g., through photolithography. Photolithography is a method of copying a desired circuit design onto a substrate by transferring a shadow, formed by radiating light onto a disk, called a mask, in which the desired circuit design is formed on a glass plate in the form of a metal pattern, to the substrate. Photolithography is one of the methods for forming a designed pattern having a predetermined shape on a substrate.

Meanwhile, the etching processes including the primary etching and the secondary etching may be performed via a general wet etching method and a general dry etching method.

In general, the wet etching method may form depressions in a substrate by generating a chemical reaction with the surfaces of the portions of the substrate, from which photoresist has been removed, by using a chemical solution. The wet etching method is generally isotropic etching, so that undercut occurs and it is difficult to form an accurate pattern. Furthermore, additional disadvantages arise in that it is difficult to perform process control, the line width that can be etched is limited, and it is difficult to process a generated etching solution.

Meanwhile, the dry etching method used to compensate for the shortcomings of the wet etching method may inject reaction gas into a vacuum chamber and then apply power, thereby forming plasma. This allows the portions of a substrate, from which photoresist has been removed, to be etched by chemically or physically reacting the plasma with the surface of the substrate. The dry etching method has advantages in that it enables anisotropic etching, process control may be easily performed, and an accurate pattern may be formed. In the present invention, the etching processes may be performed by the dry etching method.

The nanorods included in the fingerprint sensor include a piezoelectric material, and thus may generate and receive ultrasonic waves when a voltage is applied.

More specifically, when an AC voltage having a resonant frequency in an ultrasonic band in which the piezoelectric material is vibrated is applied to the piezoelectric rods in the piezoelectric sensor, the piezoelectric rods may vibrate up, down, left and right. When the piezoelectric rods may vibrate up, down, left and right, an ultrasonic signal having a predetermined frequency may be generated.

The conductive substrate and the side electrodes are a conductive substrate and side electrodes including a material selected from the group consisting of Si, GaAs, InAs, GaN, InN, Ge, ZnO, and $Ga_2O_3$. In other words, the material of the conductive substrate remaining as the side electrodes of the fingerprint sensor may be a semiconductor substrate such as an Si substrate or the like, and may include an Si-doped N- or P-type Si wafer or the like in order to improve the conductivity of the substrate. It may include an Si wafer in which doping is uniformly performed throughout the wafer.

Furthermore, the conductive substrate and the side electrodes may be made of a material having a sheet resistance of 100 Ω/sq or lower. In this case, the material of the conductive substrate and the side electrodes may be a carbon-based element, i.e., graphite, other than the above-described elements, and may be a metal composed of Al, Mg, Ti, Ni or the like.

Furthermore, the material of the conductive substrate and side electrodes may be selected from the semiconductor materials and materials having a sheet resistance of 100 Ω/sq or lower, or may be formed by combining these elements and compounds. In this case, the material of the conductive substrate and side electrodes may be a material having a shrinkage rate of 3 to 5% or lower at a sintering temperature of 800 to 1300° C. Accordingly, the ultrasonic fingerprint sensor fabricated by the method for manufacturing an ultrasonic fingerprint sensor by using a nanorod structure minimizes shrinkage occurring during heat treatment compared to the conventional electrodes such as conductive filler electrodes, metal or silver epoxy electrodes, or the like, thereby providing the advantage of implementing electrodes having a shrinkage rate of 5% to 3% or lower.

Meanwhile, the nanorod generating step may include: a nano-piezoelectric material filling step of filling the rod generation holes with the nano-piezoelectric material by spraying a powdered nano-piezoelectric material into the conductive mold; a bonding solution spraying step of spraying a bonding solution onto the conductive mold filled with the nano-piezoelectric material; a nano-piezoelectric material pressing step of densifying the filled nano-piezoelectric material by pressing the rod generation hole portion of the conductive mold onto which the bonding solution has been sprayed; and a nano-piezoelectric material sintering step of sintering the nano-piezoelectric material by sintering the conductive mold having undergone the nano-piezoelectric material pressing step.

In other words, at the nanorod generating step, the rod generation holes are filled with the nano-piezoelectric material by spraying the powdered nano-piezoelectric material in the process of filling the rod generation holes with the nano-piezoelectric material, and thus the uniformity of the filling of the mold with the piezoelectric material is improved compared to the method of filling a mold with a piezoelectric material by simply pressing a piezoelectric material in a bulk state into the mold in the conventional process of manufacturing a sensor array, thereby significantly improving the performance and appearance of the nanorods of the sensor array generated through the sintering and etching processes.

In this case, the nano-piezoelectric material filling step is performed by mixing the powdered nano-piezoelectric material with a nano-piezoelectric material in a liquid state to form a mixture and a nano-piezoelectric material in a gas state and then filling the rod generation holes with the mixture, thereby further maximizing the uniformity of the filling of the mold with the piezoelectric material mold.

Meanwhile, the nano-piezoelectric material may be at least one selected from the group consisting of a PZT ($PbZrO_3$)-based compound, a PST ($Pb(Sc,Ta)O_3$-based compound, quartz, a $(Pb,Sm)TiO_3$-based compound, a PMN ($Pb(MgNb)O_3$-PT ($PbTiO_3$)-based compound, a PVDF (poly(vinylidene fluoride))-based compound, and a PVDF-TrFe-based compound.

The present invention also provides an ultrasonic fingerprint sensor using a nanorod structure, which is manufactured by the method for manufacturing an ultrasonic fingerprint sensor by using a nanorod structure and side electrodes connecting the upper and lower electrodes of a sensor array include mold electrodes of a conductive substrate.

In other words, the ultrasonic fingerprint sensor using a nanorod structure is configured such that the side electrodes configured to connect the upper electrodes to the lower electrodes or the lower PCB are formed in the sensor array and the side electrodes are formed by implementing a mold substrate, used to generate the nanorods (piezoelectric rods) of the sensor array, as a conductive mold substrate and forming parts of the conductive mold substrate into the side electrodes. Accordingly, in the process of manufacturing a sensor array, the separate process of etching via holes into a mold substrate and the process of filling the via holes with a conductive filler, which are performed to form side electrodes, may be omitted. As a result, there are provided the advantages of shortening the process of manufacturing a fingerprint sensor having a flip-chip structure, improving manufacturing efficiency, and improving yield rate. Furthermore, the ultrasonic fingerprint sensor using a nanorod structure is manufactured via the sensor array having a stable flip-chip structure, and thus there are provided the advantages of ensuring the stable driving of the device and extending the lifespan of the device.

The ultrasonic fingerprint sensor using a nanorod structure may further include additional metal electrodes configured to connect the side electrodes, the nanorods made of a piezoelectric material and finally the upper electrodes in addition to the upper electrodes and the side electrodes in the structure of the sensor array. These additional electrodes function to promote the smoother flowing of signals from the nanorods to the side electrodes through the upper electrodes. In this case, the additional metal electrodes may include first additional metal electrodes and second additional metal electrodes, and may be implemented as emitter electrodes and receiver electrodes for signals of the nanorods, respectively.

Furthermore, the nanorods are configured to transmit signals by separate electrodes such as side electrodes without being directly connected to a dummy substrate or PCB substrate in a flip-chip structure.

Furthermore, the nanorods may be configured to have a width and height equal to or smaller than those of the side electrodes, thereby more stably implementing a sensor array including upper electrodes and lower electrodes.

The ultrasonic fingerprint sensor having a flip-chip structure incorporating a semiconductor nanorod structure according to the present invention may be configured to have a structure in which signals flow sequentially through semiconductor material electrodes and metal electrodes in an intra-device circuit through which a signal of a sensor device flows.

The semiconductor material may be a material having a semiconductor characteristic selected from the group consisting of Si, Ge, GaAs, InP, InAs, GaN, InGaN, AlGaN, ZnO, ITO, SnO, $In_2O_3$, and $Ga_2O_3$.

The semiconductor material may be a material consisting of a mixture of one or more metals selected from the group consisting of Ti, Au, Ag, Pt, Al, In, Sn, Zn, Cu, and Mg.

The semiconductor material electrode structure may have a linear structure.

When a fingerprint sensor using PZT is manufactured, a semiconductor substrate such as a Si wafer is used as a mold. When a PZT-based fingerprint sensor is manufactured using such a mold method, there is a process of etching a semiconductor wafer. In this process, etching is performed such that portions of the semiconductor wafer connected to metal electrode portions are formed in nanorod shapes through selective etching designed to etching the semiconductor wafer except for portions connected to upper electrodes.

In this case, the electrodes of the PZT-based fingerprint sensor having a thickness of 100 μm or more and the height of the nanorods using the semiconductor substrate may be manufactured to be almost the same, and thus the upper metal electrodes may be connected to a PCB, so that the sensor may be manufactured in a flip-chip structure.

Accordingly, in the process of fabricating a PZT sensor using a semiconductor wafer, the semiconductor wafer is selectively etched by the thickness of the sensor to be integrated with the upper electrodes. In this case, the wafer that can be used has Si, GaAs characterized in that it has conductivity. Ceramic-based semiconductor wafers having high conductivity, such as InAs, GaN, InN, Ge, ZnO, Ga2O3, or metal wafers having excellent conductivity may also be used. In this case, the wafer that can be used may be a ceramic-based semiconductor wafer having excellent conductivity, such as Si, GaAs, InAs, GaN, InN, Ge, ZnO, or $Ga_2O_3$, or a metal wafer having excellent conductivity. It may be also possible when a material having a sheet resistance of 100 Ω/sq or less is used as a mold.

A mold is fabricated using the wafer having semiconductor characteristics, PZT is loaded into the mold and molded and sintered, an electrode structure for connecting electrodes above the PZT to a lower PCB is formed by depositing PZT electrodes used for the fabrication of the mold, and semiconductor wafer nanorods connected to the electrodes are fabricated and connected to lower PCB electrodes.

In this case, signals generated from the upper PZT electrodes may be transferred to a lower PCB through the semiconductor nanorods, and the sensor device manufactured as described above has no wires connected to electrodes in the process of manufacturing a flip-chip structure sensor, so that there is no phenomenon in which wires are open or connected with each other, with the result that it is a structure most optimized for an operating environment. Therefore, it has the advantages of ensuring the stable driving of the device and extending the lifespan of the device, and, thus, can be implemented as a sensor structure most suitable for an ultrasonic fingerprint sensor.

In accordance with the method for manufacturing an ultrasonic fingerprint sensor by using a nanorod structure according to the present invention, a flip-chip structure is implemented by fabricating the conductive silicon or ceramic nanorod capable of being connected to the upper metal electrodes in an integrated shape in order to connect the upper electrodes to the lower PCB, and thus the advantages of ensuring the stable driving of the device and extending the lifespan of the device are achieved, with the result that the effect of being most suitably applied to an ultrasonic fingerprint sensor is obtained.

While the present invention has been described in conjunction with specific details, such as specific components, and limited embodiments and diagrams above, these are provided merely to help an overall understanding of the present invention. The present invention is not limited to these embodiments, and various modifications and alterations may be made based on the foregoing description by those having ordinary skill in the art to which the present invention pertains.

Therefore, the technical spirit of the present invention should not be determined based on only the described embodiments, and the following claims, all equivalents to the claims and equivalent modifications should be construed as falling within the scope of the spirit of the present invention.

What is claimed is:

1. A method for manufacturing an ultrasonic fingerprint sensor by using a nanorod structure, the method comprising:
   a conductive mold generating step of generating a plurality of rod generation holes spaced apart at predetermined intervals by etching a conductive substrate;
   a nanorod generating step of generating nanorods by filling the plurality of rod generation holes with a nano-piezoelectric material;
   a conductive mold etching step of generating nanorods and side electrodes by performing primary etching on the conductive mold except for the nanorods, the side electrodes, and a conductive substrate base connecting the nanorods and the side electrodes;

an insulating material filling step of filling portions etched at the conductive mold etching step with an insulating material;

a lower electrode forming step of etching the insulating material so that first end portions of the nanorods and side electrodes surrounded with the insulating material are exposed and forming lower electrodes on the exposed first end portions of the nanorods and the side electrodes;

a dummy substrate bonding step of bonding a dummy substrate to a surface of the conductive mold on which the lower electrodes are formed; and an upper electrode forming step of removing the conductive substrate base connecting the nanorod and the side electrodes and forming upper electrodes on exposed remaining end portions of the nanorods and the side electrodes.

2. The method of claim 1, wherein the conductive substrate and the side electrodes include a material selected from the group consisting of doped Si, GaAs, InAs, GaN, InN, Ge, ZnO, and $Ga_2O_3$.

3. The method of claim 1, wherein the conductive substrate and the side electrodes are made of a material having a sheet resistance of 100 Ω/sq or lower.

4. The method of claim 1, wherein the conductive substrate and the side electrodes are made of a material having a shrinkage rate of 3 to 5% or lower at a sintering temperature of 800 to 1300° C.

5. The method of claim 1, wherein the nanorod generating step comprises:

a nano-piezoelectric material filling step of filling the rod generation holes with the nano-piezoelectric material by spraying a powdered nano-piezoelectric material into the conductive mold;

a bonding solution spraying step of spraying a bonding solution onto the conductive mold filled with the nano-piezoelectric material;

a nano-piezoelectric material pressing step of densifying the filled nano-piezoelectric material by pressing the bonding solution sprayed onto the conductive mold; and a nano-piezoelectric material sintering step of sintering the nano-piezoelectric material by sintering the conductive mold having undergone the nano-piezoelectric material pressing step.

6. The method of claim 5, wherein the nano-piezoelectric material filling step is performed by mixing the powdered nano-piezoelectric material with a nano-piezoelectric material in a liquid state and a nano-piezoelectric material in a gas state to form a mixture and then filling the rod generation holes with the mixture.

7. The method of claim 1, wherein the nano-piezoelectric material is a compound selected from the group consisting of a PZT ($PbZrO_3$)-based compound, a PST ($Pb(Sc,Ta)O_3$-based compound, quartz, a $(Pb,Sm)TiO_3$-based compound, a PMN ($Pb(MgNb)O_3$-PT ($PbTiO_3$)-based compound, a PVDF (poly(vinylidene fluoride))-based compound, and a PVDF-TrFe-based compound.

8. An ultrasonic fingerprint sensor using a nanorod structure, which is manufactured by the method of claim 1.

* * * * *